United States Patent

Jones

[15] 3,645,732

[45] Feb. 29, 1972

[54] ETCHING ALCOHOL-SOLUBLE NYLON WITH AQUEOUS SOLUTIONS

[72] Inventor: Viron V. Jones, Caldwell, N.J.

[73] Assignee: Keuffel & Esser Company, Morristown, N.J.

[22] Filed: Mar. 19, 1969

[21] Appl. No.: 825,992

[52] U.S. Cl. .................................... 96/36, 96/36.3, 96/38.3, 156/2, 156/3

[51] Int. Cl. .................... G03c 5/00, G03f 7/00, G03c 11/00

[58] Field of Search..................... 96/36, 36.3, 35.1, 87, 38.3; 156/2, 3; 260/29.2 N

[56] References Cited

UNITED STATES PATENTS

| | | | |
|---|---|---|---|
| 2,299,839 | 10/1942 | McQueen | 260/29.2 N UX |
| 2,312,913 | 3/1943 | Kirby | 96/87 X |
| 2,320,088 | 5/1943 | Leekley | 260/29.2 N |
| 3,081,168 | 3/1963 | Leekley et al | 96/36.3 X |
| 3,169,066 | 2/1965 | Hoerner | 96/35.1 |
| 3,474,071 | 10/1969 | Byers et al. | 96/36.3 X |

*Primary Examiner*—David Klein
*Attorney*—J. Russell Juten, Peter F. Willig, Lionel N. White and Milford A. Juten

[57] ABSTRACT

Images and exposure masters for lithography, cartography and engineering drawing reproduction are prepared by forming a protective resist pattern on a layer of an alcohol-soluble nylon and etching away the unprotected portions of the nylon layer with an aqueous solution of sodium salicylate. The nylon layer may include distinctly colored dyes for imaging purposes or may include actinically opaque dyes, pigments or light absorbers for the preparation of photographic reproduction master sheets. The present method employs aqueous media throughout and avoids the use of flammable organic solvents.

6 Claims, No Drawings

ETCHING ALCOHOL-SOLUBLE NYLON WITH AQUEOUS SOLUTIONS

BACKGROUND OF THE INVENTION

Imaging methods have long been known which generally employ a patterned resist layer on a material which is susceptible to dissolution or etching by an appropriate medium which selectively has little or no effect upon the resist material. The art of glass etching, for example, has long since employed patterned wax layers coated on a glass object or plate for use in conjunction with the application of hydrofluoric acid as an etching fluid. With the progress of the coating art and the advent of synthetic resinous and polymeric materials, numerous formulations and combinations of coated layers were deised which carried the etching art forward to the preparation of flexible sheet materials which could be used in imaging and in the preparation of photographic masters.

Techniques and materials employed in the preparation of patterned resist layers have become extremely diverse during the development of the present art and the formation of suitable sheet materials has only been limited by the relative compositions of the etchable and resist layers. That is to say, these layers have been required to possess such basic dissimilarities in properties that they will maintain their integrity when placed, in common coating procedures, one upon the other.

The art has commonly employed many types of resist layer materials which, depending upon their desired end use, may be mechanically scribed or photographically manipulated with appropriate developing agents to form patterned resist layers. It has also been well known that these types of resist layer materials and resist-forming procedures may be readily interchangeable to effect appropriate patterns of resist on desired etchable layers. Typical of commonly used resist layers are the scribable coatings (U.S. Pat. No. 3,352,728) and the photosensitive or photoresist compositions such as described in U.S. Pat. No. 2,943,936 (bichromated colloid coatings) and in U.S. Pat. No. 3,067,034 (silver halide photographic materials).

Among the outstanding disadvantages of materials and imaging methods heretofore available are the lack of sufficient durability in one or the other of the resist or etchable layers, the requirement for an extensive and time-consuming number of essentially sequenced processing steps to effect the required resist development and etching, and the limited usefulness of etching fluids other than highly corrosive, toxic and inflammable solvents or solutions.

SUMMARY OF THE INVENTION

An object of the present invention is to provide imaging material and method which overcome the disadvantages of the prior art and in particular provides an etched image in polymeric layers rapidly and with few processing steps, and which employs the use of nonflammable, aqueous etching solutions.

In the imaging method of the present invention, an etchable layer is provided on a suitable support and comprises an alcohol-soluble polyamide resin. The etchable layer is overcoated with a resist layer by means of which there may be formed patterned resist image for the polyamide layer through the use of common scribing methods or photographic resist-forming procedures.

In the preparation of the sheet material useful in the present invention, a suitable support, which may be selected from flexible sheet material, such as paper or plastic films, is coated with a solution of one of a group of alcohol-soluble polyamides or interpolyamides and dried to form a continuous film. The polyamide layer is then coated with a layer of any well-known resist composition, such as a pigmented scribe coat or photo-resist composition, such as a pigmented scribe coat or photo-resist material shown in the above-noted references. Due to the relatively inert character of the polyamide layer material, the resist layer may be applied from solutions or dispersions which comprise fluid vehicles of aqueous, aliphatic or aromatic nature. It should be borne in mind, however, in selecting the film-forming material which comprises the resist layer, that the solution to be employed according to the present invention as an etching fluid for the polyamide layer is of an aqueous character and that the final protective resist pattern must be of such a nature as to be relatively inert or insoluble in water.

The foregoing limitation in the selection of resist-layer material should not be taken to indicate that materials coated from aqueous solutions are per se impractical in the formation of the imaging sheet of the present invention. For example, certain photoresist materials, as will be pointed out hereinafter, are initially soluble in water, but upon exposure to light, form water-insoluble patterns. Such materials are particularly useful in the preparation of resist layers in the present invention.

According to the present imaging process, a patterned resist is formed on the polyamide layer by appropriate manipulation of the resist layer, that is, by scribing the line image in the scribe layer resist to expose the underlying polyamide, or through light exposure and development steps well known in the art to form a patterned, water-insoluble resist having open or permeable areas which afford access of etching fluids to the polyamide layer.

Subsequent to the formation of the patterned resist, the material is bathed in etching fluid which dissolves away the exposed portions of the polyamide layer thereby forming a contrasting image when the polyamide layer contains a distinctly colored material, or transparent image areas when the polyamide layer is upon a transparent support and contains materials which are opaque to visible and/or actinic light.

According to the present invention, the etching fluid employed with the alcohol-soluble interpolyamide or polyamide layer materials is an aqueous solution of sodium salicylate, chloral hydrate or bromal hydrate. Such aqueous solutions have been discovered to be particularly effective in dissolving the polyamide layer in a relatively short time and have the further advantage of being nonflammable.

Image materials prepared according to the present invention are useful in reproduction masters for exposing lithographic plates and other photographic reproductions for the cartographic and graphic arts. The invention may, in addition, be used for the preparation of printing plates per se, for use in processes where the polyamide layer, when etched, forms the printing master as in the intaglio or offset printing processes.

DESCRIPTION OF THE INVENTION

The present invention is most particularly concerned with reproduction and imaging materials which comprise layers of interpolyamide and modified polyamide resins which provide films which are highly durable and of considerable cohesive strength, and are thus self-sustaining in relatively thin layers; and with a group of etching fluids which are particularly and surprisingly effective in dissolving the polyamide layers. Through the use of these polyamide resins and novel etching solutions there has now been developed, according to the present invention, an etch-imaging system which may be processed and prepared entirely through the use of aqueous compositions and solutions. The particular advantage in the use of aqueous materials is, of course, the avoidance of hazards of flammability and noxious vapors, as well as economy in preparation and use of the materials.

The polyamide resins employed in the present invention are alcohol soluble and thus lend themselves quite readily to the preparation of coating compositions devoid of highly flammable aromatic solvents. Coated films formed from such compositions are of sufficient strength to be self-sustaining in thicknesses of less than one mil and, depending upon the coating support, may be readily stripped or peeled from a surface.

The alcoholic solution of polyamide may readily be applied to any desired surface such as glass plates of flexible sheets such as paper and synthetic films of cellulose acetate, polyesters, polycarbonates and the like. Where the imaging material is ultimately destined for use as a photographic master, the support will be selected on the basis of its transparency and where maintained accuracy is essential, its dimensional stability. Polyester films are particularly useful in this respect, and further provide the type of smooth, nonpervious surface from which etch-outlined segments of polyamide film may be readily peeled.

The alcohol-soluble interpolyamides which are useful in the preparation of material of the present invention include the interpolymers of hexamethylene diammonium adipate, hexamethylene diammonium sebacate, and caprolactam, and other interpolyamides described in U.S. Pat. No. 2,285,009, namely, interpolymers of hexamethylene diamine with adipic, sebacic, aminocaproic, and oleic acid oxidation acids, and caprolactam; such as interpolymers of hexamethylenediammonium adipate, hexamethylenediammonium sebacate, and caprolactam; interpolymers of hexamethylenediammonium adipate, hexamethylenediammonium salts of oleic acid oxidation acids, and amino-caproic acid; interpolymers of hexamethylenediammonium salts of oleic acid oxidation acids, hexamethylenediammonium sebacate, and amino-caporic acid; interpolymers of hexamethylenediammonium adipate, hexamethylenediammonium salts of oleic acid oxidation acids, hexamethylenediammonium sebacate, and caprolactam; and interpolymers of hexamethylenediammonium adipate, hexamethylenediammonium salts of oleic acid oxidation acids, and hexamethylenediammonium sebacate. Additionally useful are the alcohol-soluble polyamides resulting from the methoxy-methylation of polymerized hexamethylene diammonium adipate such as described in U.S. Pat. Nos. 2,430,910; 2,430,923 and 2,430,950.

According to the process of the present invention, the layers prepared with the above-noted interpolyamides and modified polyamide resins are selectively etched, preferably to the support layer, to provide the desired pattern or image. Etching fluids discovered to be useful in the present invention include an aqueous solution which contains essentially 20 to 30 percent sodium salicylate, although minor amounts of between about 2 and 4 percent methanol, ethanol, benzylalcohol or furfuryl may be added to improve the flow characteristics of the etching solution. In addition to sodium salicylate solutions, effective etching solutions are 35 to 50 percent aqueous solutions of chloral hydrate or of bromal hydrate.

The selective application of the etching solution to the polyamide layer is most readily accomplished through the use of patterned resist compositions which are applied to the surface of the polyamide layer in the form of tapes or stencil overlays, scribed overlayers, or photographically prepared photoresist layers. The particular type of resist employed is subject only to the preferences of the practitioner and may comprise any convenient material which is nonwater soluble in its role as the patterned resist.

Some useful resist materials include strips of adhesive vinyl tape or screen-deposited vinyl inks. Image-scribed coatings comprising pigmented vinyl, acrylic, and alkyd resin compositions are particularly useful in the cartographic arts and engineering reproduction drawing arts where original drawings or drawing revisions are to be made directly on the master sheet material.

Photoresist materials useful in forming patterned resist layers from original drawings or artwork include bichromated colloid compositions which are insolubilized by exposure to actinic radiation, silver halide compositions which may be developed and etched by bleaching-reversal processes to provide patterned resists, and diazido compounds which form selectively water-soluble and water-insoluble materials upon exposure to actinic radiation. Naphthoquinone diazide materials described in U.S. Pat. Nos. 3,046,114; 3,106,465 and 3,148,983 have been found to be particularly desirable as photoresist layers in the present invention due to their ready adaptation to the formation of coating compositions and their selectively negative- or positive-working and aqueous developing characteristics upon light exposure.

Numerous types of coating materials such as dyes and pigments may be added to the polyamide layer, and the actinic opacity of photoreproduction master coatings may be improved by the addition of various light absorbers. Further, common coating adjuncts such as polymer plasticizers and extenders may be used in the coated layers in accordance with accepted coating procedures. Any of the commonly employed coating techniques may be applied equally well to the preparation of the materials of the instant invention.

PREFERRED EMBODIMENTS

EXAMPLE 1

The following coating composition was coated to a dried thickness of 0.5 mil on a 5.0 mil sheet of biaxially oriented polyethylene terephthalate film:

| | |
|---|---|
| Alcohol-soluble polyamide (hexamethylene diammonium adipate hexamethylene diammonium sebacate: caprolactam, 40:30:30) | 20 parts by weight |
| Methanol | 65 parts by weight |
| 1,1,2 trichloroethylene | 120 parts by weight |
| 2,4 dihydroxy benzophenone | 1.0 parts by weight |
| CI solvent yellow 89 | 1.0 parts by weight |
| CI solvent red 132 | 1.0 parts by weight |
| 1,2,6 hexanetriol | 1.5 parts by weight |

The following composition was coated to a dried thickness of 0.2 mil on the resulting polyamide layer to form a light-sensitive photoresist layer:

| | |
|---|---|
| ethyl acetate | 100 parts by weight |
| 5[naphthoquinone-(1,2)-diazide(2) sulfonyloxy-4]-2-hydroxy benzophenone | 5.0 parts by weight |
| dimerized rosin | 10. parts by weight |

The resulting master sheet material was imagewise exposed to a 375-watt GE sunlamp at a distance of about 15 cm. for 3 minutes through a line-image negative and was thereafter bathed for a few minutes in a solution of:

| | |
|---|---|
| sodium carbonate | 10 parts by weight |
| water | 100 parts by weight |

to remove light-struck areas from the photoresist layer. After rinsing with clear water, the coating was swabbed with a soft cloth saturated with a solution of:

| | |
|---|---|
| sodium salicylate | 30 parts by weight |
| benzylalcohol | 3 parts by weight |
| octyl phenoxy polyethoxy ethanol | 0.05 parts by weight |
| water | 100 parts by weight |

As a result of the above processing, the polyamide coating was cleanly removed from the polyester support film in the open image areas of the resist layer. The resulting material provided a photoreproduction master bearing a copy of the original line image negative which presented transparent lines and actinically opaque background areas. Further, desired portions of the actinically opaque areas enclosed by the image lines were readily removable by peeling from the base film to provide actinically transparent "open-window" areas.

The master produced according to the above procedures was used with speed 9 two-component diazotype pater and provided clear images in a commercially available high-pressure mercury lamp reproduction machine at speeds as low as 2 ft./min.

EXAMPLE 2

The procedures of Example 1 were repeated with the exception that the interpolyamide was replaced with N-methoxymethyl polyhexamethylene diammonium adipate (prepared by substitution of about 35 percent of available amide hydrogens by methoxymethyl groups). The resulting material when exposed, developed and etched, according to the procedures of Example 1, resulted in a reproduction master of comparable quality.

EXAMPLE 3

Aqueous solutions of 50 percent chloral hydrate and of 50 percent bromal hydrate were substituted for the sodium salicylate etching solution of Example 1. The resulting reproduction master was comparable with that obtained according to the procedures of Example 1.

The above examples have been presented for the purpose of illustration and should not be taken to limit the scope of the present invention. It will be apparent that the described examples are capable of many variations and modifications which are likewise to be included within the scope of the present invention as set forth in the appended claims.

What is claimed is:

1. A method of imaging which comprises:

a. providing light-sensitive material comprising a support and a coating thereon comprising:

1. a first layer comprising an alcohol-soluble polyamide film-forming resin selected from the group consisting of interpolymers of hexamethylene diamine with adipic, sebacic, aminocaproic, and oleic acid oxidation acids, and caprolactam; and methoxy-methylated polymers of hexamethylenediammonium adipate; and
2. a second layer, overlying said first layer and coextensive therewith, comprising a light-sensitive photoresist composition;

b. exposing said material imagewise to light, thereby creating in said photoresist layer a corresponding image distinguished by a difference in solubility between exposed and nonexposed areas of said layer;

c. applying to the exposed material a solvent selective in its solvency according to said difference in solubility, thereby removing the more soluble areas of said photoresist layer; and d. applying thereafter to said material in at least the open areas from which said photoresist has been removed and aqueous solution of a compound selected from the group consisting of sodium salicylate, chloral hydrate, and bromal hydrate, thereby dissolving the portions of said polyamide layer disposed beneath said open areas and removing said polyamide layer portions from said material.

2. A method according to claim 1 wherein said support is an actinically transparent polymeric film and said first layer is actinically opaque and of sufficient thickness and strength to be self-sustaining and capable of being peeled from said support film.

3. A method of forming an image master for actinic light reproduction processes comprising:

a. providing a master sheet material comprising an actinically transparent support having a coating thereon comprising a continuous film of an actinically opaque composition comprising an alcohol-soluble polyamide selected from the class consisting of interpolyamides of hexamethylenediammonium adipate, hexamethylenediammonium sebacate, and caprolactam; interpolyamides of hexamethylenediammonium adipate, hexamethylenediammonium salts of oleic acid oxidation acids, and amino-caproic acid; interpolyamides of hexamethylenediammonium adipate, hexamethylenediammonium salts of oleic acid oxidation acids, hexamethylenediammonium sebacate, and caprolactam; interpolyamides of hexamethylenediammonium adipate, hexamethylenediammonium salts of oleic acid oxidation acids, and hexamethylenediammonium sebacate; and N-methoxymethyl polyhexamethylene-diammoniumadipate;

b. forming on said polyamide film an image-defining pattern of a water-insoluble film of resist composition, said pattern comprising resist-free areas through which said polyamide film is accessible;

c. bathing said master sheet in at least said resist-free areas with an etching fluid consisting essentially of an aqueous solution of a compound selected from the group consisting of sodium salicylate chloral hydrate, and bromal hydrate, thereby dissolving said polyamide film in said resist-free areas; and d. removing dissolved polyamide film from said master sheet.

4. A method according to claim 3 wherein said master sheet material includes a layer of photosensitive composition overlying and coextensive with said film of polyamide composition, said photosensitive composition being capable of forming, in accordance with light exposure, a pattern of differential solubility in a selected solvent; and wherein the forming of said resist pattern comprises:

a. exposing said photosensitive layer imagewise to light, thereby creating said pattern of differential solubility;

b. contacting the thus-exposed layer with said selected solvent, thereby dissolving portions of said layer in the areas defined by said pattern of differential solubility; and c. removing the dissolved portions of said layer from said master sheet.

5. A method according to claim 4 wherein said photoresist composition comprises a naphthoquinone diazide.

6. A method according to claim 3 wherein said film of polyamide composition is of sufficient thickness and strength to be self-sustaining and capable of being peeled from said support; and which further comprises the step of peeling from said support a portion of said polyamide composition film enclosed within the pattern formed by the dissolution removal of said polyamide film areas.

* * * * *